United States Patent
Schaefer et al.

(10) Patent No.: US 11,884,900 B2
(45) Date of Patent: Jan. 30, 2024

(54) CLEANING COMPOSITIONS AND METHODS OF USE THEREOF

(71) Applicant: Fujifilm Electronic Materials U.S.A., Inc., N. Kingstown, RI (US)

(72) Inventors: Zachary L. Schaefer, Mesa, AZ (US); Eric Turner, Phoenix, AZ (US); Carl Ballesteros, San Tan Valley, AZ (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 232 days.

(21) Appl. No.: 17/411,429

(22) Filed: Aug. 25, 2021

(65) Prior Publication Data

US 2022/0064577 A1  Mar. 3, 2022

Related U.S. Application Data

(60) Provisional application No. 63/071,730, filed on Aug. 28, 2020.

(51) Int. Cl.
| | | |
|---|---|---|
| C11D 1/66 | (2006.01) | |
| C11D 11/00 | (2006.01) | |
| H01L 21/02 | (2006.01) | |
| C11D 3/20 | (2006.01) | |
| C11D 1/00 | (2006.01) | |

(52) U.S. Cl.
CPC .......... *C11D 11/0047* (2013.01); *C11D 1/008* (2013.01); *C11D 1/662* (2013.01); *C11D 3/2075* (2013.01); *H01L 21/02065* (2013.01); *H01L 21/02074* (2013.01)

(58) Field of Classification Search
CPC .................................................. C11D 11/0047
USPC ......................................................... 510/175
See application file for complete search history.

(56) References Cited

U.S. PATENT DOCUMENTS

| | | |
|---|---|---|
| 2018/0244532 A1 | 8/2018 | Killeen et al. |
| 2019/0060461 A1 | 2/2019 | Solaiman et al. |

FOREIGN PATENT DOCUMENTS

| | | | | |
|---|---|---|---|---|
| EP | 1 953 237 | 8/2008 | ............. | C12P 19/44 |
| EP | 3 290 500 | 3/2018 | ............. | C11D 1/37 |
| EP | 3290020 A1 * | 3/2018 | ............. | A61K 8/45 |
| EP | 3686265 A1 * | 7/2020 | | |

OTHER PUBLICATIONS

International Search Report and Written Opinion issued in International Application No. PCT/US2021/047542, dated Dec. 8, 2021.

\* cited by examiner

*Primary Examiner* — Gregory E Webb
(74) *Attorney, Agent, or Firm* — Fish & Richardson P.C.

(57) ABSTRACT

The present disclosure relates to cleaning compositions that are used to clean semiconductor substrates. These cleaning compositions can remove the defects/contaminants arising from previous processing on the semiconductor substrates and thereby make the substrates appropriate for further processing. The cleaning compositions described herein primarily contain at least one pH adjusting agent and at least one biosurfactant.

18 Claims, No Drawings

US 11,884,900 B2

CLEANING COMPOSITIONS AND METHODS OF USE THEREOF

CROSS-REFERENCE TO RELATED APPLICATION

The present application claims priority to U.S. Provisional Application Ser. No. 63/071,730, filed on Aug. 28, 2020, the contents of which are hereby incorporated by reference in their entirety.

BACKGROUND

The semiconductor industry is continually driven to improve chip performance by further miniaturization of devices through process and integration innovations. Chemical Mechanical Polishing/Planarization (CMP) is a powerful technology as it makes many complex integration schemes at the transistor level possible, thereby facilitating increased chip density.

CMP is a process used to planarize or flatten a wafer surface by removing material using abrasion-based physical processes concurrently with surface-based chemical reactions. In general, a CMP process involves applying CMP slurry (aqueous chemical formulation) to a wafer surface while contacting the wafer surface with a polishing pad and moving the polishing pad in relation to the wafer. Slurries typically include an abrasive component and dissolved chemical components, which can vary significantly depending upon the materials (e.g., metals, metal oxides, metal nitrides, dielectric materials such as silicon oxide, silicon nitride, etc.) present on the wafer that will be interacting with the slurry and the polishing pad during the CMP process.

After CMP processing, a variety of contaminants may be present on the surface of the polished wafer. Contaminants may include, for example, particulate abrasive from the CMP slurry, organic residue from the pad or slurry components, and material removed from the wafer during the CMP process. If left on the surface of the polished wafer, these contaminants may lead to failures during further wafer processing steps and/or to diminished device performance. Thus, the contaminants need to be effectively removed so that the wafer can predictably undergo further processing and/or achieve optimal device performance. The process of removing these post-polishing contaminants or residues on the wafer surface after CMP is called post-CMP cleaning. The formulations used in this post-CMP cleaning process are called post-CMP (P-CMP) cleaning solutions. These P-CMP cleaning solutions/formulations solubilize or otherwise loosen the defects remaining on the wafer surface after the CMP step and thereby remove these defects and make the wafer surface clean. This cleaning process ensures that, once the wafer undergoes further processing, the device performance and chip yields are optimized.

SUMMARY

In semiconductor chip manufacturing, defectivity on the wafer surface is key to the yield of the wafers which determines the top and bottom line of chip companies globally. A typical wafer goes through about 1000 processes before chips are made and the individual dies are cut from the wafer. At each of these processes, the defectivity is monitored pre- & post-process. CMP is an important step in chip manufacturing. However, the CMP step introduces a significant amount of defects after the polishing steps. Thus, after the CMP polishing step, a post-CMP (P-CMP) cleaning composition is typically applied to the wafer surface to reduce the defects. The present disclosure discusses novel P-CMP cleaning compositions which can effectively reduce wafer contaminants and defects without corroding the components of the wafer, all while having a significantly reduced environmental footprint.

The present disclosure relates to cleaning compositions that are used to clean semiconductor substrates. These cleaning compositions remove the defects/contaminants on the semiconductor substrates arising from previous processing and thereby make the substrates appropriate for further processing.

In one aspect, this disclosure features a cleaning composition that includes at least one pH adjusting agent; and at least one biosurfactant selected from the group consisting of glycolipids, lipopeptides, and mixtures thereof, where the composition has a pH of from about 1 to about 14.

In another aspect, this disclosure features a method for cleaning a substrate, the method including polishing a substrate (e.g., a wafer) by using a CMP composition to form a polished substrate; and contacting the polished substrate with a cleaning composition described herein to clean the polished substrate.

This summary is provided to introduce a selection of concepts that are further described below in the detailed description. This summary is not intended to identify key or essential features of the claimed subject matter, nor is it intended to be used as an aid in limiting the scope of the claimed subject matter.

DETAILED DESCRIPTION

Embodiments disclosed herein relate generally to compositions and methods of using said compositions to clean substrates. In particular, the compositions can be used to clean substrates after a CMP process. However, the cleaning compositions described herein can also find use in removing residue and/or contaminants from a substrate surface after an etching process, after an ashing process, or after a plating process.

As defined herein, residue and/or contaminants can include components present in a CMP polishing composition that has been used to polish the substrate to be cleaned (e.g., abrasives, molecular components, polymers, acids, bases, salts, surfactants, etc.), compounds produced during the CMP process as a result of chemical reactions between the substrate and the polishing composition and/or between components of the polishing composition, polishing pad polymeric particles, polishing byproducts, organic or inorganic residues (from CMP slurry or CMP pad), substrate (or wafer) particles liberated during the CMP process, and/or any other removable materials that are known to deposit on a substrate after a CMP process.

In one or more embodiments, this disclosure relates to cleaning compositions that include at least one biosurfactant. As used herein, the term "biosurfactant" is intended to denote amphiphilic organic molecules, such as organic molecules that include both hydrophobic groups (e.g., an alkyl chain) and hydrophilic groups (e.g., a carboxylic acid group), which are produced by a biological organism (e.g., a microorganism). Commonly used surfactants in the semiconductor industry are produced using petroleum based precursors and/or energy intensive chemical reactions. In contrast, a biosurfactant can have a favorable environmental and energy profile (e.g., biodegradability and/or production by less energy intensive processes), while still being capable of providing the performance characteristics necessary to execute advanced semiconductor operations. Additionally, due to their unique chemical structures, biosurfactants can also impart enhanced performance (e.g., increasing removal of defects on a wafer and/or reducing removal rates of certain dielectric and/or metal films) during semiconductor operations when used alone or in combination with surfactants that are not biosurfactants. Thus, the use of biosurfactants within the semiconductor industry presents an opportunity for improved or sustained performance combined with a significantly reduced environmental footprint.

In one or more embodiments, a cleaning composition described herein includes at least one pH adjusting agent (e.g., an acid such as an organic acid) and at least one biosurfactant. In one or more embodiments, a cleaning composition of the present disclosure can include from about 0.00001% to about 50% (e.g., from about 0.01% to about 5%) by weight of the at least one pH adjusting agent, from about 0.00001% to about 50% (e.g., from about 0.005% to about 10%) by weight of the at least one biosurfactant, and the remaining percent by weight (e.g., from about 60% to about 99.99% by weight) of a solvent (e.g., deionized water).

In one or more embodiments, the present disclosure provides for a concentrated P-CMP cleaning composition that can be diluted with water to obtain a point-of-use (POU) cleaning composition by up to a factor of 20, or up to a factor of 50, or up to a factor of 100, or up to a factor or 200, or up to a factor of 400, or up to a factor of 800, or up to a factor of 1000. In other embodiments, the present disclosure provides a point-of-use (POU) cleaning composition that can be used directly for cleaning substrate surfaces.

In one or more embodiments, a POU cleaning composition can include from about 0.00001% to about 5% by weight of at least one pH adjusting agent (e.g., at least one amino acid or at least one carboxylic acid) and from about 0.00001% to about 5% by weight of at least one biosurfactant. In another embodiment, a POU cleaning composition can include from about 0.00001% to about 5% by weight of at least one amino acid, from about 0.00001% to about 5% by weight of at least one biosurfactant, and from about 0.00001% to about 5% by weight of at least one carboxylic acid.

In one or more embodiments, a concentrated P-CMP cleaning composition can include from about 0.01% to about 30% by weight (e.g., from about 0.05% to about 20% by weight) of at least one pH adjusting agent (e.g., at least one amino acid or at least one carboxylic acid) and from about 0.005% to about 15% by weight of at least one biosurfactant. In another embodiment, a concentrated P-CMP cleaning composition can include from about 0.005% to about 20% by weight of at least one amino acid, from about 0.005% to about 15% by weight of at least one biosurfactant, and from about 0.005% to about 20% by weight of at least one carboxylic acid.

In one or more embodiments, the cleaning compositions described herein can include at least one (e.g., two or three) pH adjusting agent. In some embodiments, the pH adjusting agent can be an acid (e.g., an organic or inorganic acid) or a base (e.g., an organic or inorganic base). In some embodiments, the pH adjusting agent can be an organic acid or a salt thereof. In such embodiments, the at least one pH adjusting agent can be selected from the group consisting of carboxylic acids (e.g., polycarboxylic acids or acrylic acids), amino acids, sulfonic acids, phosphoric acid, phosphonic acids, or salts thereof. In some embodiments, the at least one organic acid or a salt thereof can be selected from the group consisting of formic acid, gluconic acid, acetic acid, malonic acid, citric acid, propionic acid, malic acid, adipic acid, succinic acid, lactic acid, oxalic acid, hydroxyethylidene diphosphonic acid, 2-phosphono-1,2,4-butane tricarboxylic acid, aminotrimethylene phosphonic acid, hexamethylenediamine tetra(methylenephosphonic acid), bis(hexamethylene)triamine phosphonic acid, amino acetic acid, peracetic acid, potassium acetate, phenoxyacetic acid, glycine, bicine, diglycolic acid, glyceric acid, tricine, alanine, histidine, valine, phenylalanine, proline, glutamine, aspartic acid, glutamic acid, arginine, lysine, tyrosine, benzoic acid, salts thereof, and mixtures thereof. In one or more embodiments, the cleaning compositions include at least two organic acids (e.g., a first organic acid and a second organic acid) as the pH adjusting agents.

In one or more embodiments, the pH adjusting agent can be a base. For example, the at least one pH adjusting agent can be selected from the group consisting of hydroxides (e.g., ammonium hydroxide, potassium hydroxide, cesium hydroxide, or choline hydroxide), alkanolamines (e.g., monoethanolamine, diethanolamine, triethanolamine, methylethanolamine, methyldiethanolamine), tetraalkylammonium hydroxides (e.g., tetrabutylammonium hydroxide, tetrapropylammonium hydroxide, tetraethylammonium hydroxide, tetramethylammonium hydroxide, ethyltrimethylammonium hydroxide, diethyldimethylammonium hydroxide, dimethyldipropylammonium hydroxide, benzyltrimethylammonium hydroxide, or tris(2-hydroxyethyl) methylammonium hydroxide), and any combinations thereof. In some embodiments, the pH adjusting agent can be free of any metal ion.

In one or more embodiments, the at least one pH adjusting agent is in an amount from about 0.00001% to about 50% by weight of the cleaning composition. For example, the at least one pH adjusting agent (e.g., an organic acid or a salt thereof) can be at least about 0.00001% (e.g., at least about 0.00005%, at least about 0.0001%, at least about 0.0005%, at least about 0.001%, at least about 0.005%, at least about 0.01%, at least about 0.02%, at least about 0.05%, at least about 0.1%, at least about 0.5%, or at least about 1%) by weight to at most about 50% (e.g., at most about 45%, at most about 40%, at most about 35%, at most about 30%, at most about 25%, at most about 20%, at most about 15%, at most about 10%, at most about 5%, or at most about 1%) by weight of the cleaning compositions described herein.

In one or more embodiments, the cleaning compositions described herein can be either acidic or basic. In some embodiments, the polishing compositions can have a pH ranging from at least about 1 to at most about 14. When the cleaning compositions are acidic, the pH can range from at least about 1 (e.g., at least about 1.5, at least about 2, at least about 2.5, at least about 3, at least about 3.5, at least about 4, at least about 4.5, or at least about 5) to at most about 7 (e.g., at most about 6.5, at most about 6, at most about 5.5, at most about 5, at most about 4.5, at most about 4). When the cleaning compositions are basic, the pH can range from at least about 7 (e.g., at least about 7.5, at least about 8, at least about 8.5, at least about 9, at least about 9.5, at least about 10, at least about 10.5, at least about 11, at least about 11.5, or at least about 12) to at most about 14 (e.g., at most about 13.5, at most about 13, at most about 12.5, at most about 12, at most about 11.5, at most about 11, at least about 10.5, or at most about 10).

In one or more embodiments, the cleaning compositions described herein can include at least two or three organic acids (e.g., an amino acid or a carboxylic acid). In some embodiments, the first organic acid is in an amount of from about 0.0005% to about 50% by weight of the cleaning compositions. In some embodiments, the second organic acid is in an amount of from about 0.0005% to about 30% by weight of the cleaning compositions. In yet some other embodiments, the third organic acid is in an amount of from about 0.0005% to about 10% by weight of the cleaning compositions.

In one or more embodiments, the cleaning compositions described herein can include at least one (e.g., two or three) biosurfactant. In one or more embodiments, the at least one biosurfactant can be a microbial growth by-product (i.e., the biosurfactant can be produced by microorganisms), such as a microbial metabolite. The microbial growth by-product (i.e., the biosurfactant) can be collected from a cultivated yeast or fungus strain (i.e., the microorganisms) through a purification process that removes the microorganisms involved in producing the microbial growth by-product.

In one or more embodiments, the biosurfactant can be selected from the group consisting of glycolipids, lipopeptides, and mixtures thereof. In one or more embodiments, the biosurfactant includes a glycolipid selected from the group consisting of a rhamnolipid, a sophorolipid, a trehalose lipid, a mannosylerythritol lipid, and mixtures thereof. In one or more embodiments, the biosurfactant includes a lipopeptide selected from the group consisting of surfactin, iturin, fengycin, lichenysin, and mixtures thereof.

In one or more embodiments, the glycolipid is a rhamnolipid biosurfactant selected from a mono-rhamnolipid, a di-rhamnolipid, and mixtures thereof. Rhamnolipid biosurfactants are surface active compounds released by microorganisms. They are biodegradable, non-toxic, and eco-friendly materials. Their production depends on the fermentation conditions, environmental factors and nutrient availability. In some embodiments, rhamnolipids have a glycosyl head group (i.e., a rhamnose moiety), and a fatty acid tail (e.g., containing one or more (e.g., two or three) $C_{10}$-$C_{14}$ 3-hydroxyalkanoic acid or ester group). Depending on the fermentation details, a rhamnolipid's fatty acid tail can be 10-28 (e.g., 20-28 or 24-28) carbons long. In some embodiments, the fatty acid tail can include a 3-(hydroxyalkanoyloxy)alkanoic acid (HAA) group. For example, the fatty acid tail can include a group of formula (A): —$R_1$—C(O)O—$R_2$—COOH, in which each of $R_1$ and $R_2$, independently, is a $C_{10}$-$C_{14}$ straight chained or branched alkylene group.

Formula I shows the structure of a typical mono-rhamnolipid, RLL or R1 (alpha-L-Rhamnopyranosyl-beta-hydroxydecanoyl-beta-hydrooxydecanoate, $C_{26}H_{48}O_9$ (504 g/mol)):

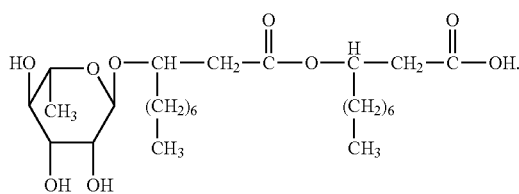

I

Formula II shows the structure of another typical di-rhamnolipid, RRLL or R2 (2-O-alpha-L-rhamnopyranosyl-alpha-L-rhamnopyranosyl-beta-hydroxydecanoyl-beta-hydrooxydecanoate, $C_{32}H_{58}O_{13}$ (650 g/mol)):

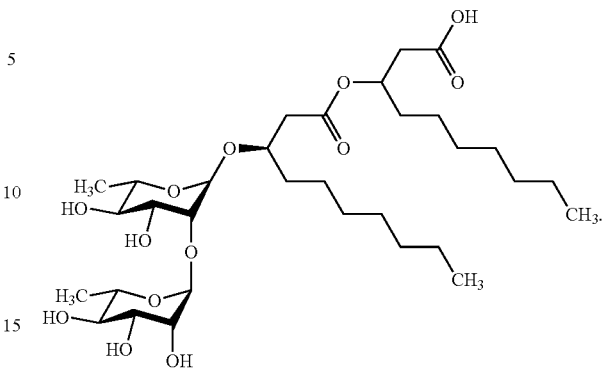

II

As mentioned above, there are two major groups of rhamnolipids; mono-rhamnolipids and di-rhamnolipids. Mono-rhamnolipids have a single rhamnose sugar ring. A common name for mono-rhamnolipid RLL (which is most often produced by *P. aeruginosa*) is: L-rhamnosyl-beta-hydroxydecanoyl-beta-hydroxydecanoate (often referred to as Rha-C10-C10) with a formula of $C_{26}H_{48}O_9$. The IUPAC name is 3-[3-[(2R,3R,4R,5R,6S)-3,4,5-trihydroxy-6-methyloxan-2-yl]oxydecanoyloxy]decanoic acid.

Di-rhamnolipids have two rhamnose sugar rings. A common name for di-rhamnolipid RRLL is: L-rhamnosyl-L-rhamnosyl-beta-hydroxydecanoyl-beta-hydroxydecanoate (often referred to as Rha-Rha-C10-C10) with a formula of $C_{32}H_{58}O_{13}$. The IUPAC name is: 3-[3-[4,5-dihydroxy-6-methyl-3-(3,4,5-trihydroxy-6-methyloxan-2-yl)oxyoxan-2-yl]oxydecanoyloxy]decanoic acid. Some other forms or names for the more common di-rhamnolipids include: L-rhamnopyranosyl-L-rhamnopyranosyl-beta-hydroxydecanoyl-beta-hydroxydecanoate (often referred to as Rha-Rha-C10-C10), L-rhamnopyranosyl-L-rhamnopyranosyl-beta-hydroxydecanoyl-beta-hydroxydodecanoate (often referred to as Rha-Rha-C10-C12), and L-rhamnopyranosyl-L-rhamnopyranosyl-beta-hydroxytetradecanoyl-beta-hydroxytetradecanoate (often referred to as Rha-Rha-C14-C14).

Rhamnolipid formulations for use as biosurfactants in the cleaning compositions described herein can be crude or highly purified rhamnolipids. A crude rhamnolipid formulation contains a rhamnolipid, having many impurities which can include both external impurities (e.g., those arising from the biological production method), and/or a variety of various rhamnolipid mixtures, which cause a reduced effect on the formulation. A highly purified rhamnolipid formulation contains a rhamnolipid whose external impurities have been removed, and/or a mixture of rhamnolipids (e.g., di-rhamnolipids, mono-rhamnolipids, or a mixture thereof) that have been purified to meet certain parameters to cause an increased effect on the formulation. In one or more embodiments, the weight % ratio of mono-rhamnolipid to di-rhamnolipid in the cleaning compositions is in the range of between about 0.1:99.9 and 99.9:0.1, respectively. For example, the weight % ratio of mono-rhamnolipid to di-rhamnolipid in the polishing compositions can be from at least about 0.1:99.9 (e.g., at least about 0.5:99.5, at least about 1:99, at least about 5:95, at least about 10:90, at least about 15:85, at least about 20:80, at least about 25:75, at least about 30:70, at least about 35:65, at least about 40:60, at least about 45:55, or at least about 50:50) to at most about 99.9:0.1 (e.g., at most about 99.5:0.5, at most about 99:1, at most about 95:5, at most about 90:10, at most about 85:15, at most about 80:20, at most about 75:25, at most about 70:30, at most about 65:35, at most about 60:40, at most about 55:45, or at most about 50:50).

In one or more embodiments, the rhamnolipid formulations are made by eliminating unwanted impurities from the initial mixture obtained from a microorganism and then establishing the percentage and type of rhamnolipid to be present in the final cleaning composition, and simply diluting the rhamnolipid formulations with the solvent used for the cleaning composition. Crude rhamnolipid formulations and highly purified rhamnolipid formulations can be prepared by methods well-known to those of skill in the art. In some embodiments, rhamnolipid formulations for use as biosurfactants in the polishing compositions described herein can include at least about 50% (e.g., at least about 55%, at least about 65%, at least about 70%, at least about 75%, at least about 80%, at least about 85%, at least about 90%, at least about 95%, at least about 98%, at least about 99%, at least about 99.5%, or at least about 99.9%) by weight rhamnolipid.

In one or more embodiments, the glycolipid is a sophorolipid biosurfactant. Sophorolipids (also known as sophorose lipids or SLs) are a group of biosurfactants consisting of a dimeric sugar (sophorose) and a hydroxyl fatty acid, linked by a beta-glycosidic bond. There are two types of SLs, namely, the acidic (non-lactonic) SLs and the lactonic SLs. The hydroxyl fatty acid moiety of the acidic SLs has a free carboxylic acid functional group, while that of the lactonic SLs forms a macrocyclic lactone ring with the 4"-hydroxyl group of the sophorose by intramolecular esterification. Sophorose lipids are generally categorized into two forms: (1) the lactone form represented by the following formula (III):

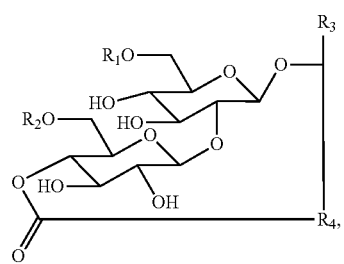

III wherein $R_1$ and $R_2$ each represent H or $COCH_3$; $R_3$ represents H or $CH_3$; and $R_4$ represents a saturated or unsaturated $C_{12-16}$ hydrocarbon group (e.g., a $C_{12-16}$ alkylene group optionally containing one or more (e.g., 2, 3, 4, or 5) double bonds) when $R_3$ is H, and $R_4$ represents a saturated or unsaturated $C_{11-15}$ hydrocarbon group (e.g., a $C_{11-15}$ alkylene group optionally containing one or more (e.g., 2, 3, 4, or 5) double bonds) when $R_3$ is $CH_3$, and (2) the acid form represented by the following formula (IV):

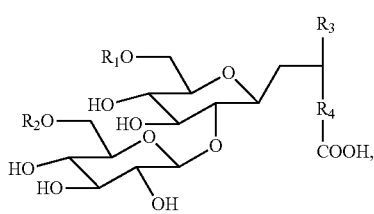

IV wherein $R_1$ to $R_4$ are as defined above. A commercial example of a sophorolipid biosurfactant is REWOFERM SL ONE available from Evonik (Essen, Germany), which includes a mixture of sophorolipids (i.e., lactone and acid forms) produced by fermenting glucose, fatty acids, and C18 unsaturated esters with glycerol in the presence of yeast *Candida bombicola* and includes about 30-50 wt % sophorolipids.

As is clear from the above, sophorose lipids have a number of derivatives which are characterized by the positions and number of acetyl groups, the presence or absence of double bonds in the fatty acid side chain, the length of the carbon chain of the fatty acid side chain, the position of the glycosidic ether bond in the fatty acid side chain, the positions of hydroxyl groups on the sophorose moiety that is a part of a lactone ring, and other structural parameters. Sophorose lipids generally occur as a mixture of these compounds. In general, sophorose lipids are produced in a highly viscous oil form that is difficult to handle. However, sophorose lipids in the diacetyl lactone form, which are comparatively high in hydrophobicity, can be produced in a solid form. In one or more embodiments, the glycolipid is a sophorolipid that includes at least about 5% (e.g., at least about 10%, at least about 15%, at least about 20%, at least about 25%, at least about 30%, at least about 35%, at least about 40%, at least about 45%, or at least about 50%) by weight to at most about 95% (e.g., at most about 90%, at most about 85%, at most about 80%, at most about 75%, at most about 70%, at most about 65%, at most about 60%, at most about 55%, at most about 50%) by weight acidic-type sophorolipid.

In one or more embodiments, the biosurfactant is in an amount of from at least about 0.00001% (e.g., at least about 0.00005%, at least about 0.0001%, at least about 0.0005%, at least about 0.001%, at least about 0.002%, at least about 0.004%, at least about 0.005%, at least about 0.006%, at least about 0.008%, at least about 0.01%, at least about 0.02%, at least about 0.03%, at least about 0.04%, at least about 0.05%, at least about 0.1%, at least about 0.5%, or at least about 1%) by weight to at most about 50% (e.g., at most about 45%, at most about 40%, at most about 35%, at most about 30%, at most about 25%, at most about 20%, at most about 15%, at most about 10%, at most about 5%, at most about 1%, at most about 0.5%, at most about 0.1%, or at most about 0.05%) by weight of the cleaning compositions described herein.

In one or more embodiments, one or more (e.g., two or three) biosurfactants are the only surfactant(s) in the cleaning compositions described herein. However, in some embodiments, the cleaning compositions can also include one or more (e.g., two or three) additional surfactants, distinct from the biosurfactant, selected from the group consisting of anionic surfactants, non-ionic surfactants, amphoteric surfactants, cationic surfactants, and mixtures thereof.

Examples of suitable cationic surfactants include, but are not limited to, aliphatic amine salts and aliphatic ammonium salts.

Examples of suitable non-ionic surfactants include, but are not limited to, an ether-type surfactant, an ether ester-type surfactant, an ester-type surfactant, and an acetylene-based surfactant. Examples of the ether-type surfactant include polyethylene glycol mono-4-nonylphenyl ether, polyethylene glycol monooleyl ether, and triethylene glycol monododecyl ether. An example of the ether ester-type surfactant is a polyoxyethylene ether of a glycerin ester. Examples of the ester-type surfactant include a polyethylene glycol fatty acid ester, a glycerin ester, and a sorbitan ester. Examples of the acetylene-based surfactant include ethylene oxide adducts of acetylene alcohol, acetylene glycol, and acetylene diol.

Examples of suitable amphoteric surfactants include, but are not limited to, betaine-based surfactants.

Examples of suitable anionic surfactants include, but are not limited to, carboxylic acid salts, sulfonic acid salts, sulfate salts, and phosphate salts. Examples of the carboxylic acid salts include fatty acid salts (e.g., soaps) and alkyl ether carboxylic acid salts. Examples of the sulfonic acid salts include alkylbenzenesulfonic acid salts, alkylnaphthalenesulfonic acid salts, and $\alpha$-olefin sulfonic acid salts. Examples of the sulfate salts include higher alcohol sulfate salts and alkyl sulfate salts. Examples of the phosphate salts include alkyl phosphates and alkyl ester phosphates.

When the cleaning compositions described herein include a second surfactant, as described above, the amount of the second surfactant can range from at least about 0.001% (e.g., at least about 0.002%, at least about 0.0003%, at least about 0.0005%, at least about 0.01%, at least about 0.05%, or at least about 0.1%) by weight to at most about 1% (e.g., at most about 0.8%, at most about 0.6%, at most about 0.5%, at most about 0.4%, at most about 0.2%, or at most about 0.1%) by weight of the total mass of the cleaning compositions.

In one or more embodiments, the cleaning compositions described herein can include at least one (e.g., two or three) anionic polymer. In one or more embodiments, the at least one anionic polymer can include one or more anionic groups, such as carboxylate, sulfate, and phosphate groups. In one or more embodiments, the at least one anionic polymer is formed from one or more monomers selected from the group consisting of (meth)acrylic acid, maleic acid, acrylic acid, vinyl phosphonic acid, vinyl phosphoric acid, vinyl sulfonic acid, allyl sulfonic acid, styrene sulfonic acid, acrylamide, acrylamidopropyl sulfonic acid, and sodium phosphinite. In more specific embodiments, the at least one anionic polymer can be selected from the group consisting of poly(4-styrenylsulfonic) acid (PSSA), polyacrylic acid (PAA), poly(vinylphosphonic acid) (PVPA), poly(2-acrylamido-2-methyl-1-propanesulfonic acid), poly(N-vinylacetamide) (PNVA), polyethylenimine (PEI), anionic poly (methyl methacrylate) (PMMA), anionic polyacrylamide (PAM), polyaspartic acid (PASA), anionic poly(ethylene succinate) (PES), anionic polybutylene succinate (PBS), poly(vinyl alcohol) (PVA), 2-propenoic acid copolymer with 2-methyl-2-((1-oxo-2-propenyl)amino)-1-propanesulfonic acid monosodium salt and sodium phosphinite, 2-propenoic acid copolymer with 2-methyl-2-((1-oxo-2-propenyl) amino)-1-propanesulfonic acid monosodium salt and sodium hydrogen sulfite sodium salt, and 2-acrylamido-2-methyl-1-propanesulfonic acid-acrylic acid copolymer, poly (4-styrenesulfonic acid-co-acrylic acid-co-vinylphosphonic acid) terpolymer, and mixtures thereof. Without wishing to be bound by theory, it is believed that the anionic polymer can solubilize hydrophobic polishing materials and/or defects on a wafer surface and facilitate their removing during a post-CMP cleaning process.

In one or more embodiments, the at least one anionic polymer can have a weight average molecular weight ranging from at least about 250 g/mol (e.g., at least about 500 g/mol, at least about 1000 g/mol, at least about 2,000 g/mol, at least about 5,000 g/mol, at least about 10,000 g/mol, at least about 50,000 g/mol, at least about 100,000 g/mol, at least about 200,000 g/mol, or at least about 250,000 g/mol) to at most about 500,000 g/mol (e.g., at most about 400,000 g/mol, at most about 300,000 g/mol, at most about 200,000 g/mol, at most about 100,000 g/mol, or at most about 50,000 g/mol, or at most about 10,000 g/mol). In some embodiments, the at least one anionic polymer can have a weight average molecular weight ranging from at least about 1000 g/mol to at most about 10,000 g/mol. In some embodiments, the at least one anionic polymer can have a weight average molecular weight ranging from at least about 2000 g/mol to at most about 6,000 g/mol. In yet some embodiments, the at least one anionic polymer can have a weight average molecular weight of about 5,000 g/mol.

In some embodiments, the cleaning compositions described herein include one anionic polymer, such as poly(vinylphosphonic acid), 2-acrylamido-2-methyl-1-propanesulfonic acid-acrylic acid copolymer, or poly(4-styrenesulfonic acid-co-acrylic acid-co-vinylphosphonic acid) terpolymer. In some embodiments, the cleaning compositions described herein include two anionic polymers, such as (1) poly(4-styrenylsulfonic) acid and poly(acrylic) acid or (2) 2-acrylamido-2-methyl-1-propanesulfonic acid-acrylic acid copolymer and poly(acrylic) acid.

In one or more embodiments, the at least one anionic polymer is in an amount from about 0.00001% to about 50% by weight of the cleaning compositions described herein. For example, the at least one anionic polymer can be at least about 0.00001% (e.g., at least about 0.00005%, at least about 0.0001%, at least about 0.0005%, at least about 0.001%, at least about 0.005%, at least about 0.01%, at least about 0.05%, at least about 0.1%, at least about 0.5%, or at least about 1%) by weight to at most about 50% (e.g., at most about 45%, at most about 40%, at most about 35%, at most about 30%, at most about 25%, at most about 20%, at most about 15%, at most about 10%, at most about 5%, or at most about 1%) by weight of the cleaning compositions described herein.

In some embodiments, the cleaning composition can include at least two or three anionic polymers. In some embodiments, the first anionic polymer is in an amount of from about 0.0005% to about 50% by weight of the cleaning compositions described herein. In some embodiments, the second anionic polymer is in an amount of from about 0.0005% to about 30% by weight of the cleaning compositions described herein. In yet some other embodiments, the third anionic polymer is in an amount of from about 0.0005% to about 10% by weight of the cleaning compositions described herein.

In one or more embodiments, the cleaning compositions described herein can further include at least one (e.g., two, three, or four) optional additive selected from the group consisting of an azole compound, a dienoic acid, a corrosion inhibitor, a chelating agent, and a water-soluble polymer.

The azole compound is not particularly limited, but specific examples thereof include substituted or unsubstituted triazoles (e.g., benzotriazoles), substituted or unsubstituted tetrazoles, substituted or unsubstituted diazoles (e.g., imidazoles, benzimidazoles, thiadiazoles, and pyrazoles), and substituted or unsubstituted benzothiazoles. Herein, a substituted diazole, triazole, or tetrazole refers to a product obtained by substitution of one or two or more hydrogen atoms in the diazole, triazole, or tetrazole with, for example, a carboxyl group, an alkyl group (e.g., a methyl, ethyl, propyl, butyl, pentyl, or hexyl group), a halogen group (e.g., F, Cl, Br, or I), an amino group, or a hydroxyl group. In one or more embodiments, the azole compound can be selected from the group consisting of tetrazole, benzotriazole, tolyltriazole, methyl benzotriazole (e.g., 1-methyl benzotriazole, 4-methyl benzotriazole, and 5-methyl benzotriazole), ethyl benzotriazole (e.g., 1-ethyl benzotriazole), propyl benzotriazole (e.g., 1-propyl benzotriazole), butyl benzotriazole (e.g., 1-butyl benzotriazole and 5-butyl benzotriazole), pentyl benzotriazole (e.g., 1-pentyl benzotriazole), hexyl benzotriazole (e.g., 1-hexyl benzotriazole and 5-hexyl benzotriazole), dimethyl benzotriazole (e.g., 5,6-dimethyl benzotriazole), chloro benzotriazole (e.g., 5-chloro benzotriazole), dichloro benzotriazole (e.g., 5,6-dichloro benzotriazole), chloromethyl benzotriazole (e.g., 1-(chloromethyl)-1-H-benzotriazole), chloroethyl benzotriazole, phenyl benzotriazole, benzyl benzotriazole, aminotriazole, aminobenzimidazole, pyrazole, imidazole, aminotetrazole, adenine, benzimidazole, thiabendazole, 1,2,3-triazole, 1,2,4-triazole, 1-hydroxybenzotriazole, 2-methylbenzothiazole, 2-aminobenzimidazole, 2-amino-5-ethyl-1,3,4-thiadiazole, 3,5-diamino-1,2,4-triazole, 3-amino-5-methylpyrazole, 4-amino-4H-1,2,4-triazole, and combinations thereof. Without wishing to be bound by theory, it is believed that the azole compounds can be used as a corrosion inhibitor in the cleaning compositions described herein to reduce the removal of certain materials (e.g., metals or dielectric materials) during the cleaning process.

In some embodiments, the azole compound can be from at least about 0.001% (e.g., at least about 0.002%, at least about 0.004%, at least about 0.005%, at least about 0.006%, at least about 0.008%, at least about 0.01%, at least about 0.02%, at least about 0.04%, at least about 0.05%, at least about 0.06%, at least about 0.08%, or at least about 0.1%) by weight to at most about 0.2% (e.g., at most about 0.18%, at most about 0.16%, at most about 0.15%, at most about 0.14%, at most about 0.12%, at most about 0.1%, at most about 0.08%, at most about 0.06%, at most about 0.05%, at most about 0.04%, at most about 0.03%, at most about 0.02%, or at most about 0.01%) by weight of the cleaning compositions.

In one or more embodiments, the cleaning composition described herein can optionally include a dienoic acid (i.e., an acid containing a diene). In some embodiments, the dienoic acid can have from 5 to 22 carbons (e.g., 5, 6, 7, 8, 9, 10, 11, 12, 13, 14, 15, 16, 17, 18, 19, 20, 21, or 22) carbons. In some embodiments, the dienoic acid can have from 5 to 12 (e.g., 5, 6, 7, 8, 9, 10, 11, or 12) carbons. In some embodiments, the dienoic acid can be a carboxylic acid containing a diene, such as 2,4-pentadienoic acid, 5-phenylpenta-2,4-dienoic acid, 2-hydroxypenta-2,4-dienoic acid, 2,4-hexadienoic acid (sorbic acid), 4,5-hexadienoic acid, 4,6-heptadienoic acid, 2,6-dimethylhepta-2,5-dienoic acid, (3E,5E)-hepta-3,5-dienoic acid, (2E,5Z)-hepta-2,5-dienoic acid, octa-3,5-dienoic acid, (Z)-3,7-dimethyl-2,6-octadienoic acid, 5,7-nonadienoic acid, (E,Z)-2,4-decadienoic acid, 2,5-decadienoic acid, undecadienoic acid, dodecadienoic acid, tridecadienoic acid, tetradecadienoic acid, pentadecadienoic acid, hexadecadienoic acid, heptadecadienoic acid, (9Z,12E)-octadeca-9,12-dienoic acid, octadeca-10,12-dienoic acid, (10E,15Z)-9,12,13-trihydroxyoctadeca-10,15-dienoic acid, 13(S)-hydroxyoctadeca-9Z,11E-dienoic acid, nonadecadienoic acid, henicosadienoic acid, docosadienoic acid, and eicosa-11,14-dienoic acid. In some embodiments, the at least one organic acid can include a mixture (e.g., two or three) of the dienoic acids described herein. Without wishing to be bound by theory, it is believed that including a dienoic acid can improve corrosion inhibition of certain metal and metal containing films (e.g., W, Cu, TaN or TiN) on the substrate during a post-CMP cleaning process.

In one or more embodiments, the dienoic acid can be at least about 0.0001% (e.g., at least about 0.0005%, at least about 0.001%, at least about 0.005%, at least about 0.01%, at least about 0.02%, at least about 0.04%, or at least about 0.05%) by weight to at most about 0.5% (e.g., at most about 0.4%, at most about 0.3%, at most about 0.2%, at most about 0.1%, at most about 0.08%, at most about 0.06%, at most about 0.05%, at most about 0.04%, at most about 0.03%, at most about 0.02%, at most about 0.01%, or at most about 0.005%) by weight of the cleaning composition described herein.

In some embodiments, the cleaning compositions described herein can optionally include a non-azole corrosion inhibitor. Examples of non-azole corrosion inhibitors include dienoic acids, alkylamines (e.g., ethylamine, propylamine, or butylamine) and organic phosphonic acids (e.g., ethylphosphonic acid).

In some embodiments, the non-azole corrosion inhibitor can be from at least about 0.001% (e.g., at least about 0.002%, at least about 0.004%, at least about 0.005%, at least about 0.006%, at least about 0.008%, at least about 0.01%, at least about 0.02%, at least about 0.04%, at least about 0.05%, at least about 0.06%, at least about 0.08%, or at least about 0.1%) by weight to at most about 0.2% (e.g., at most about 0.18%, at most about 0.16%, at most about 0.15%, at most about 0.14%, at most about 0.12%, at most about 0.1%, at most about 0.08%, at most about 0.06%, at most about 0.05%, at most about 0.04%, at most about 0.03%, at most about 0.02%, or at most about 0.01%) by weight of the cleaning compositions described herein.

In one or more embodiments, the chelating agent can be selected from the group consisting of gluconic acid, lactic acid, citric acid, tartaric acid, malic acid, glycolic acid, malonic acid, formic acid, oxalic acid, acetic acid, propionic acid, peracetic acid, succinic acid, lactic acid, amino acetic acid, phenoxyacetic acid, bicine, diglycolic acid, glyceric acid, tricine, alanine, histidine, valine, phenylalanine, proline, glutamine, aspartic acid, glutamic acid, arginine, lysine, tyrosine, benzoic acid, ammonia, 1,2-ethanedisulfonic acid, 4-amino-3-hydroxy-1-naphthalenesulfonic acid, 8-hydroxyquinoline-5-sulfonic acid, aminomethanesulfonic acid, benzenesulfonic acid, hydroxylamine O-sulfonic acid, methanesulfonic acid, m-xylene-4-sulfonic acid, poly(4-styrenesulfonic acid), polyanetholesulfonic acid, p-toluenesulfonic acid, trifluoromethane-sulfonic acid, salts thereof, and mixtures thereof. Without wishing to be bound by theory, it is believed that the chelating agent can serve as a removal rate enhancer to facilitate removal of certain materials on a substrate.

In some embodiments, the chelating agent can be from at least about 0.1% (e.g., at least about 0.2%, at least about 0.3%, at least about 0.4%, at least about 0.5%, at least about 0.6%, at least about 0.7%, at least about 0.8%, at least about 0.9%, or at least about 1%) by weight to at most about 10% (e.g., at most about 8%, at most about 6%, at most about 5%, at most about 4%, at most about 2%, at most about 1%, at most about 0.8%, at most about 0.6%, or at most about 0.5%) by weight of the cleaning compositions described herein.

The water-soluble polymer is not particularly limited, but specific examples thereof include polyacrylamide, polyvinyl alcohol, polyvinylpyrrolidone, polyacrylic acid, and hydroxyethyl cellulose. Without wishing to be bound by theory, it is believed that the water-soluble polymer can serve as a removal rate inhibitor to reduce the removal rate of uncertain exposed materials on a substrate that do not intend to be removed or should be removed at a lower removal rate during the cleaning process.

In some embodiments, the water-soluble polymer can be from at least about 0.01% (e.g., at least about 0.02%, at least about 0.03%, at least about 0.04%, at least about 0.05%, at least about 0.06%, at least about 0.07%, at least about 0.08%, at least about 0.09%, or at least about 0.1%) by weight to at most about 1% (e.g., at most about 0.8%, at most about 0.6%, at most about 0.5%, at most about 0.4%, at most about 0.2%, at most about 0.1%, at most about 0.08%, at most about 0.06%, or at most about 0.05%) by weight of the cleaning compositions described herein.

In one or more embodiments, the cleaning compositions described herein can be substantially free of one or more of certain ingredients, such as organic solvents, pH adjusting agents (e.g., acids or bases), quaternary ammonium compounds (e.g., salts or hydroxides), amines, alkali bases (such as alkali hydroxides), fluorine containing compounds (e.g., fluoride compounds or fluorinated polymers/surfactants), silicon containing compounds such as silanes (e.g., alkoxysilanes), nitrogen containing compounds (e.g., amino acids, amines, or imines (e.g., amidines such as 1,8-diazabicyclo[5.4.0]-7-undecene (DBU) and 1,5-diazabicyclo[4.3.0]non-5-ene (DBN))), salts (e.g., halide salts or metal salts), polymers (e.g., non-ionic, cationic, or anionic polymers) such as polyols, inorganic acids (e.g., hydrochloric acid, sulfuric acid, phosphoric acid, or nitric acid), surfactants (e.g., cationic surfactants, anionic surfactants, non-ionic surfactants, or those other than the biosurfactant described herein), plasticizers, oxidizing agents (e.g., $H_2O_2$), corrosion inhibitors (e.g., azole or non-azole corrosion inhibitors), electrolytes (e.g., polyelectrolytes), and/or abrasives (e.g., silica/ceria abrasives, non-ionic abrasives, surface modified abrasives, or negatively/positively charged abrasive). The halide salts that can be excluded from the cleaning compositions include alkali metal halides (e.g., sodium halides or potassium halides) or ammonium halides (e.g., ammonium chloride), and can be fluorides, chlorides, bromides, or iodides. As used herein, an ingredient that is "substantially free" from a cleaning composition refers to an ingredient that is not intentionally added into the cleaning composition. In some embodiments, the cleaning compositions described herein can have at most about 1000 ppm (e.g., at most about 500 ppm, at most about 250 ppm, at most about 100 ppm, at most about 50 ppm, at most about 10 ppm, or at most about 1 ppm) of one or more of the above ingredients that are substantially free from the cleaning compositions. In some embodiments, the cleaning compositions described herein can be completely free of one or more of the above ingredients.

As applied to post-CMP cleaning operations, the cleaning compositions described herein are usefully employed to clean contaminants present on a substrate surface after a CMP processing step. In one or more embodiments, the contaminants can be at least one selected from the group consisting of abrasives, particles, organic residue, polishing byproducts, slurry byproducts, slurry induced organic residues, inorganic polished substrate residue, etc. In one or more embodiments, the cleaning compositions of the present disclosure can be employed to remove organic residues constituted by organic particles which are insoluble in water and thus remain on the substrate surface post the CMP polishing step. Without being bound by theory, it is believed that the organic particles are generated from polishing composition components that deposit on a substrate surface after polishing and are insoluble and thus stick to contaminants on the wafer surface. The presence of these contaminants causes defect counts on the wafer surface. These defect counts, when analyzed on a Defect measuring tool such as the AIT-XUV tool from KLA Tencor Company, provide the total defect count (TDC) that is a sum of all the individual defect counts. In one or more embodiments, the cleaning compositions described herein remove at least about 30%, or at least about 50%, or at least about 75%, or at least about 80%, or at least about 90%, or at least about 95%, or at least about 98%, or at least about 99%, or at least about 99.5%, or at least about 99.9% of the total defect counts (TDC) remaining on a substrate surface after a polishing/CMP process.

In one or more embodiments, this disclosure features a method of cleaning a substrate (e.g., a wafer). The method can include polishing a substrate by using a CMP composition to form a polished substrate, and contacting the polished substrate with a cleaning composition described herein to clean the polished substrate. In some embodiments, the CMP composition can include a solvent (e.g., water), a pH adjusting agent (e.g., an acid or a base), and abrasive particles. In some embodiments, polishing a substrate can be performed by applying a polishing composition to a surface of the substrate; and bringing a pad into contact with the surface of the substrate and moving the pad in relation to the substrate.

In post-CMP cleaning applications, the cleaning composition can be applied in any suitable manner to the substrate to be cleaned. For example, the cleaning composition can be used with a large variety of conventional cleaning tools and techniques (e.g., on-platen buffing/cleaning, brush scrubbing, spin rinse dry, etc.). In some embodiments, the substrate can include at least one of silicon oxides (e.g., tetraethyl orthosilicate (TEOS), high density plasma oxide (HDP), high aspect ratio process oxide (HARP), or borophosphosilicate glass (BPSG)), spin on films (e.g., films based on inorganic particle or films based on cross-linkable carbon polymer), silicon nitride, silicon carbide, high-K dielectrics (e.g., metal oxides of hafnium, aluminum, or zirconium), silicon (e.g., polysilicon (p-Si), single crystalline silicon, or amorphous silicon), carbon, metals (e.g., tungsten, copper, cobalt, ruthenium, molybdenum, titanium, tantalum, or aluminum), metal nitrides (e.g., titanium nitride or tantalum nitride), and mixtures or combinations thereof.

In one or more embodiments, the cleaning method described herein includes the steps of: (A) providing a substrate containing post CMP residues; (B) contacting the substrate with a cleaning composition described herein; (C) rinsing the substrate with a suitable rinse solvent; and (D) optionally, drying the substrate by any suitable means that removes the rinse solvent and does not compromise the integrity of the substrate.

The substrate can be contacted with a cleaning composition by any suitable method, such as placing the cleaning composition into a tank and immersing and/or submerging the substrate into the cleaning composition, spraying the cleaning composition onto the substrate, streaming the cleaning composition onto the substrate, or any combinations thereof.

The cleaning compositions of the present disclosure can be effectively used up to a temperature of about 90° C. (e.g., from about 25° C. to about 80° C., from about 30° C. to about 60° C., or from about 40° C. to about 60° C.).

Similarly, cleaning times can vary over a wide range depending on the particular cleaning method and temperature employed. When cleaning in an immersion batch type process, a suitable time range is, for example, up to about 60 minutes (e.g., from about 1 minute to about 60 minutes, from about 3 minutes to about 20 minutes, or from about 4 minutes to about 15 minutes). Cleaning times for a single wafer process can range from about 10 seconds to about 5 minutes (e.g., from about 15 seconds to about 4 minutes, from about 15 seconds to about 3 minutes, or from about 20 seconds to about 2 minutes).

To further promote the cleaning ability of the cleaning compositions of the present disclosure, mechanical agitation means can be employed. Examples of suitable agitation means include circulation of the cleaning composition over the substrate, streaming or spraying the cleaning composition over the substrate, and ultrasonic or megasonic agitation during the cleaning process. The orientation of the semiconductor substrate relative to the ground can be at any angle. Horizontal or vertical orientations are preferred.

Subsequent to the cleaning, the substrate can be rinsed with a suitable rinse solvent for about 5 seconds up to about 5 minutes with or without agitation means. Examples of suitable rinse solvents include, but are not limited to, deionized (DI) water, methanol, ethanol, isopropyl alcohol, N-methylpyrrolidinone, gamma-butyrolactone, dimethyl sulfoxide, ethyl lactate and propylene glycol monomethyl ether acetate. Alternatively, aqueous rinses with pH >8 (such as dilute aqueous ammonium hydroxide) can be employed. Preferred examples of rinse solvents include, but are not limited to, dilute aqueous ammonium hydroxide, DI water, methanol, ethanol and isopropyl alcohol. The solvent can be applied using means similar to that used in applying a cleaning composition described herein. The cleaning composition may have been removed from the substrate prior to the start of the rinsing step or it may still be in contact with the substrate at the start of the rinsing step. Preferably, the temperature employed in the rinsing step is between 16° C. and 27° C.

Optionally, the semiconductor substrate is dried after the rinsing step. Any suitable drying means known in the art may be employed. Examples of suitable drying means include spin drying, flowing a dry gas across the semiconductor substrate, or heating the semiconductor substrate with a heating means such as a hotplate or infrared lamp, Marangoni drying, Rotagoni drying, IPA drying or any combinations thereof. Drying times will be dependent on the specific method employed but are typically on the order of 30 seconds up to several minutes.

In one or more embodiments, the method that uses a cleaning composition described herein can further include producing a semiconductor device (e.g., an integrated circuit device such as a semiconductor chip) from the substrate treated by the cleaning composition through one or more steps. For example, photolithography, ion implantation, dry/wet etching, plasma etching, deposition (e.g., PVD, CVD, ALD, ECD), wafer mounting, die cutting, packaging, and testing can be used to produce a semiconductor device from the substrate treated by the cleaning composition described herein.

EXAMPLE

In the following example, 200 mm silicon nitride wafers were first polished using a polishing slurry and a hard pad. Post-CMP cleaning was subsequently performed on the wafers using on-platen buffing/cleaning with an AMAT Mirra tool and a soft pad in conjunction with a cleaning composition described in the example. After the post-CMP cleaning was completed, the wafers were rinsed with deionized water and dried using a Sematech SRD (spin rinse dry) tool. The total defect counts on the wafers were then measured using an AIT-XUV tool from KLA Tencor Company.

Example 1

In this example, the ability of a biosurfactant to improve the cleaning ability of a commercial post-CMP cleaner was tested. The following post-CMP cleaning compositions were tested in this example: (1) water only (Comp. 1); (2) a commercial post-CMP cleaner (Comp. 2); and (3) the same commercial post-CMP cleaner with two loading levels of a biosurfactant (Comps. 3 and 4). Table I summarizes the test results.

TABLE 1

| | Total Defect Counts | SiN Removal Rate (Å/min) |
|---|---|---|
| Composition 1 | 13,756 | 7.37 |
| Composition 2 | 10,292 | 10.31 |
| Composition 3 (about 8 ppm BS) | 10,067 | 9.07 |
| Composition 4 (about 160 ppm BS) | 3,839 | 8.87 |

BS = Biosurfactant

The results show that the addition of the biosurfactant to the commercial p-CMP cleaner decreased both the total defect counts and the SiN removal rate when compared to the commercial p-CMP cleaner without the biosurfactant. In particular, the addition of about 160 ppm biosurfactant in Composition 4 decreased the TDC by about 63% and the SiN removal rate by about 14% compared to the values obtained for the commercial p-CMP cleaner without the biosurfactant (i.e., Composition 2). This result is significant because minimizing TDC and material removal rate during p-CMP cleaning is extremely important to achieving a high yield of usable substrates for further processing.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims.

What is claimed is:

1. A method for cleaning a substrate, comprising:
   polishing a substrate by using a CMP composition to form a polished substrate; and
   contacting the polished substrate with a cleaning composition to clean the polished substrate,
   wherein the cleaning composition comprises:
      at least one pH adjusting agent; and
      at least one biosurfactant selected from the group consisting of glycolipids, lipopeptides, and mixtures thereof;
      wherein the cleaning composition has a pH of from about 1 to about 14.

2. The method of claim 1, wherein the at least one pH adjusting agent comprises a carboxylic acid, an amino acid, a sulfonic acid, phosphoric acid, or a phosphonic acid.

3. The method of claim 1, wherein the at least one pH adjusting agent comprises at least one carboxylic acid.

4. The method of claim 1, wherein the at least one pH adjusting agent is selected from the group consisting of formic acid, acetic acid, malonic acid, citric acid, propionic acid, malic acid, adipic acid, succinic acid, lactic acid, oxalic acid, hydroxyethylidene diphosphonic acid, 2-phosphono-1,2,4-butane tricarboxylic acid, aminotrimethylene phosphonic acid, hexamethylenediamine tetra(methylenephosphonic acid), bis(hexamethylene)triamine phosphonic acid, amino acetic acid, peracetic acid, potassium acetate, phenoxyacetic acid, glycine, bicine, diglycolic acid, glyceric acid, tricine, alanine, histidine, valine, phenylalanine, proline, glutamine, aspartic acid, glutamic acid, arginine, lysine, tyrosine, benzoic acid, and mixtures thereof.

5. The method of claim 1, wherein the at least one pH adjusting agent is in an amount of from about 0.00001% to about 50% by weight of the cleaning composition.

6. The method of claim 1, wherein the cleaning composition comprises at least two pH adjusting agents.

7. The method of claim 1, wherein the at least one biosurfactant comprises a glycolipid selected from the group consisting of a rhamnolipid, a sophorolipid, a trehalose lipid, a mannosylerythritol lipid, and mixtures thereof.

8. The method of claim 7, wherein the glycolipid is a rhamnolipid selected from the group consisting of a mono-rhamnolipid, a di-rhamnolipid, and a mixture thereof.

9. The method of claim 7, wherein the at least one biosurfactant comprises a sophorolipid of formula (III):

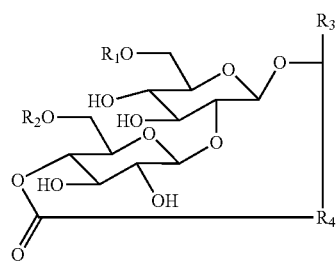

III in which $R_1$ and $R_2$ each represent H or $COCH_3$; $R_3$ represents H or $CH_3$; and $R_4$ represents a saturated or unsaturated $C_{12-16}$ hydrocarbon group when $R_3$ is H, and $R_4$ represents a saturated or unsaturated $C_{11-15}$ hydrocarbon group when $R_3$ is $CH_3$.

10. The method of claim 7, wherein the at least one biosurfactant comprises a sophorolipid of formula (IV):

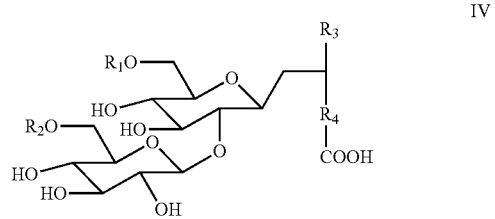

IV in which $R_1$ and $R_2$ each represent H or $COCH_3$; $R_3$ represents H or $CH_3$; and $R_4$ represents a saturated or unsaturated $C_{12-16}$ hydrocarbon group when $R_3$ is H, and $R_4$ represents a saturated or unsaturated $C_{11-15}$ hydrocarbon group when $R_3$ is $CH_3$.

11. The method of claim 7, wherein the glycolipid comprises at least about 5% to at most about 95% by weight acidic-type sophorolipid.

12. The method of claim 1, wherein the at least one biosurfactant comprises a lipopeptide selected from the group consisting of surfactin, iturin, fengycin, lichenysin, and mixtures thereof.

13. The method of claim 1, wherein the at least one biosurfactant is in an amount from about 0.00001% to about 50% by weight of the cleaning composition.

14. The method of claim 1, wherein the at least one biosurfactant is the only surfactant in the cleaning composition.

15. The method of claim 1, wherein the cleaning composition further comprises:
a second surfactant different from the at least one biosurfactant, the second surfactant being selected from the group consisting of anionic surfactants, non-ionic surfactants, and cationic surfactants.

16. The method of claim 1, wherein the cleaning composition further comprises at least one anionic polymer.

17. The method of claim 1, wherein the cleaning composition further comprises at least one dienoic acid.

18. The method of claim 1, wherein the substrate is a wafer having a surface comprising SiN, SiC, TiN, TaN, W, silicon oxides, Cu, Co, Ru, Mo, Ti, Ta, Al, carbon, silicon, hafnium oxide, aluminum oxide, zirconium oxide, p-Si, or a combination thereof.

* * * * *